United States Patent [19]

Fletcher et al.

[11] 4,049,930

[45] Sept. 20, 1977

[54] HEARING AID MALFUNCTION DETECTION SYSTEM

[76] Inventors: James C. Fletcher, Administrator of the National Aeronautics and Space Administration, with respect to an invention of; Roger L. Kessinger, Houston, Tex.

[21] Appl. No.: 739,914

[22] Filed: Nov. 8, 1976

[51] Int. Cl.² .............................................. G01R 25/00
[52] U.S. Cl. .......................... 179/175.1 A; 179/107 R; 330/2
[58] Field of Search ............... 179/175.1 A, 175.31 R, 179/170 F, 175, 107 R; 340/249, 248 A, 248 B, 248 D; 330/2

[56] References Cited

U.S. PATENT DOCUMENTS

| 2,425,002 | 8/1947 | Pfleger | 179/175.31 R |
| 3,833,856 | 9/1974 | Roeschlein | 330/2 |
| 3,879,662 | 4/1975 | Barneck | 340/248 A |
| 3,879,717 | 4/1975 | Gruensfelder | 340/249 |
| 3,979,657 | 9/1976 | Yorksie | 340/249 |

OTHER PUBLICATIONS

"Maintenance" in ATE Journal, vol. 17, No. 2, Apr. 1961, by King et al., pp. 84–91.

*Primary Examiner*—Douglas W. Olms
*Attorney, Agent, or Firm*—John R. Manning; Marvin J. Marnock; Marvin F. Matthews

[57] ABSTRACT

Disclosed is a malfunction detection system for detecting malfunctions in electrical signal processing circuits. In a particular embodiment shown, malfunctions of a hearing aid in the form of frequency distortion and/or inadequate amplification by the hearing aid amplifier, as well as weakening of the hearing aid power supply are detectable. A test signal is generated and a timed switching circuit periodically applies the test signal to the input of the hearing aid amplifier in place of the input signal from the microphone. The resulting amplifier output is compared with the input test signal used as a reference signal. The hearing aid battery voltage is also periodically compared to a reference voltage. Deviations from the references beyond preset limits cause a warning system to operate. In the method of the invention, the input to a circuit to be tested is periodically interrupted and, for a fixed test time interval, a test signal is applied to the circuit to be tested. The output of the circuit to be tested is compared with a reference signal, and deviation in amplitude and/or frequency between the two signals beyond preset limits triggers a warning. During the test time interval, the voltage level of the power supply for the circuit to be tested is also compared to a reference voltage, and the warning system is triggered if the power supply voltage falls below the reference voltage.

28 Claims, 2 Drawing Figures

HEARING AID MALFUNCTION DETECTION SYSTEM

ORIGIN OF THE INVENTION

The invention described herein was made in the performance of work under a NASA contract and is subject to the provisions of S305 of the National Aeronautics and Space Act of 1958, Public Law 85-568 (72 Stat. 435; 45 U.S. C. 2457).

BACKGROUND OF THE INVENTION

1. Field of the Invention

The present invention pertains to methods and apparatus for detecting malfunctions in electrical circuitry. More particularly, the present invention relates to methods and apparatus for detecting the loss in fidelity of signal reproduction as well as the loss in signal strength by an electrical circuit designed to process and reproduce electrical signals. Malfunctions of a circuit to be tested may be detected by the present invention whether such malfunctions are due to defects in the circuit to be tested proper, or due to loss of power caused by insufficient voltage provided by the pertinent power supply. Particular applications of the present invention are found in the detection of malfunctions in hearing aids.

2. Description of Prior Art

Various techniques for detecting malfunctions in electrical systems are well known. Traditional trouble-shooting techniques include removing a circuit to be tested from its normal functioning environment, and utilizing one or more signal-measuring devices while applying a test signal to various points in the circuit to be tested. Such trouble-shooting techniques, however, require that the circuit to be tested be unavailable for its intended functional purpose during the testing period. An alternate approach is to provide testing apparatus coupled to the circuitry to be tested on a permanent basis, thereby allowing specific parameters of the tested circuit to be monitored at all times. Such continuous monitoring may be significantly costly due to excessive power consumption by the test apparatus, and, where numerous parameters are being monitored, the test equipment may add considerable bulk to the original circuitry which is being monitored.

Particular testing problems arise in the field of hearing aids. Desirable features of modern hearing aids include compactness and light weight. Consequently, the addition of multiple-parameter, constant-monitoring test apparatus to a hearing aid may cause the entire unit to exceed critical bounds of both size and weight. A program whereby a hearing aid is periodically removed from service and tested for malfunctions is unsatisfactory, particularly in view of the fact that a replacement for the hearing aid being tested is required for the benefit of the user needing hearing assistance. Furthermore, since the user in need of a hearing aid may well depend upon such hearing assistance to function normally in society, the loss of use of a hearing aid due to a hearing aid malfunction between periodic testing times can result in the unavailability of such hearing assistance at unpredictable times, and for indeterminate periods.

An additional, and critical, factor involving the need to test hearing aids occurs when the user is a child, or is, for some other reason, relatively unsophisticated in the use of a hearing aid. In such case, a hearing aid malfunction may be present, and affecting the use of the hearing aid, without the detection of such malfunction by the user. For example, the strength of the signal produced by the hearing aid may be so poor that the user does not hear a significant portion of the signal picked up by the microphone of the hearing aid. Similarly, the tones from the ear piece of the hearing aid may not be true compared to the tones detected by the microphone due to frequency distortion in the reproduction of the signal by the amplifier of the hearing aid. In either case, a child using the hearing aid may not realize that there are deficiencies in the reproduction of the signal by the hearing aid. Continued use of the hearing aid under such circumstances may significantly impair the user's ability to function in a normal manner.

SUMMARY OF THE INVENTION

The malfunction detection system of the present invention may be applied to test any electrical signal processing circuit. A timed switching circuit periodically interrupts the signal processing by the electrical circuit to be tested for a fixed test time interval. During the test time interval, a test signal of constant frequency is applied to the circuit to be tested at the point where the signal processing was interrupted. At some later stage in the circuit to be tested, an output signal is obtained in the form of a processed reproduction of the applied test signal. The processed test signal is compared to the original test signal in a difference detector. If the processed test signal differs from the reference signal in amplitude and/or frequency beyond preset limits, a triggering signal is generated and transmitted to a warning system. The warning system is thus operated to indicate the presence of a malfunction in the signal processing circuit that is being tested. Similarly, during the test time interval, the power supply provided for the circuit to be tested is itself tested by comparing its voltage output to a reference voltage generated by the malfunction detection system. If the power supply voltage for the circuit to be tested lies below the reference voltage, a triggering signal is also generated to operate the warning system.

In the application to a hearing aid, the malfunction detection system interrupts the signal from the microphone of the hearing aid to the hearing aid amplifier. A test signal of specific frequency is then processed by the hearing aid amplifier and transmitted to the hearing aid ear piece during the test time interval. Consequently, the production of a tone characteristic of the test signal as amplified by the hearing aid is an indication to the user that the hearing aid malfunction detection unit is operable. The processed test signal is also obtained at the ear piece stage for comparison with a reference signal in the malfunction detection system. The reference signal is generated by the same signal generator that produces the test signal. By proper calibration of adjustable parameters within the hearing aid detection system, the reference signal and the test signal processed by a hearing aid amplifier in perfect functioning condition may be obtained in essentially identical amplitude, frequency, and phase. Then, the test signal as processed by a hearing aid amplifier which is not functioning ideally will be distinguished by a variation in amplitude and/or frequency compared to the reference signal. If such deviation exceeds a preset limit, then a triggering signal is generated which operates a warning system indicating the presence of such a malfunction. During the test time interval, the battery which serves as the power supply for the hearing aid is also tested by comparing its output voltage to a reference voltage generated by the malfunction detection system. If the hearing aid battery voltage is less than the reference voltage, the triggering signal is generated to operate the warning system.

The warning system may be in the form of a light or other visible alarm, or may produce an audible signal, or may be a combination of the two types. The warning system is operable only during the test time interval, but, once a malfunction is detected either in the hearing aid amplifier or in the voltage output of the hearing aid battery, the warning system remains operating once triggered. Only by turning off the malfunction detection system, or by operating a reset switch, can the user stop the operation of the warning system. Consequently the warning system will remain functioning until the user has sensed its operation and, therefore, the presence of a malfunction of the hearing aid.

The method of the present invention involves the periodic interruption of the functioning of a circuit to be tested, such as a hearing aid amplifier, and the application of a test signal to the circuit to be tested and a comparison of the signal produced thereby with a reference signal. Deviations of the test signal output by the circuit to be tested from the reference signal in signal strength and/or frequency are considered symptoms of the presence of a malfunction in the circuit to be tested. Such differences are detected, and used to generate a signal which ultimately triggers a warning system to indicate the presence of such malfunctions. The power supply for the signal to be tested is also periodically tested itself by comparing its output voltage with that of a reference voltage. A triggering signal to operate the warning system is also generated whenever, during such test time, the voltage output of the power supply for the circuit to be tested falls below the reference voltage.

The present invention has the advantage of monitoring a circuit to be tested, such as a hearing aid, on a periodic basis without significantly removing the circuit from use. Since the actual testing of the circuit is done automatically, with apparatus essentially added to the circuit to be tested, the actual test time interval need be but very brief. For example, in practice, the test time interval adequate for testing a hearing aid with the malfunction detection system and method of the present invention is approximately 0.5 second. At this rate, the hearing aid may be tested frequently, say, once every half hour of use time, without appreciably interfering with the use of the hearing aid by one needing its assistance.

The components necessary to construct the circuitry necessary to carry out the present invention are relatively small and light weight. Consequently, a malfunction detection system of the present invention may be readily adapted for use with a hearing aid without increasing the bulk or weight of such hearing aid to inconvenient levels.

While the present invention is described and shown hereinafter as applied to test a hearing aid amplifier by sending the test signal through the entire amplifier stage, the actual portion of the circuit to be tested can be chosen relatively at will, and made to include one or more amplifier stages as well as portions of individual amplifier stages. However, in the application to a hearing aid, the detection of a malfunction anywhere in the hearing aid amplifier is all that is needed to determine that the hearing aid should be withdrawn from use for repair or replacement. This is true since a malfunction that significantly disrupts the fidelity of reproduction of signals detected by the hearing aid is sufficient to cause the hearing aid to be relatively useless to the user.

DESCRIPTION OF PREFERRED EMBODIMENTS

Figure 1:
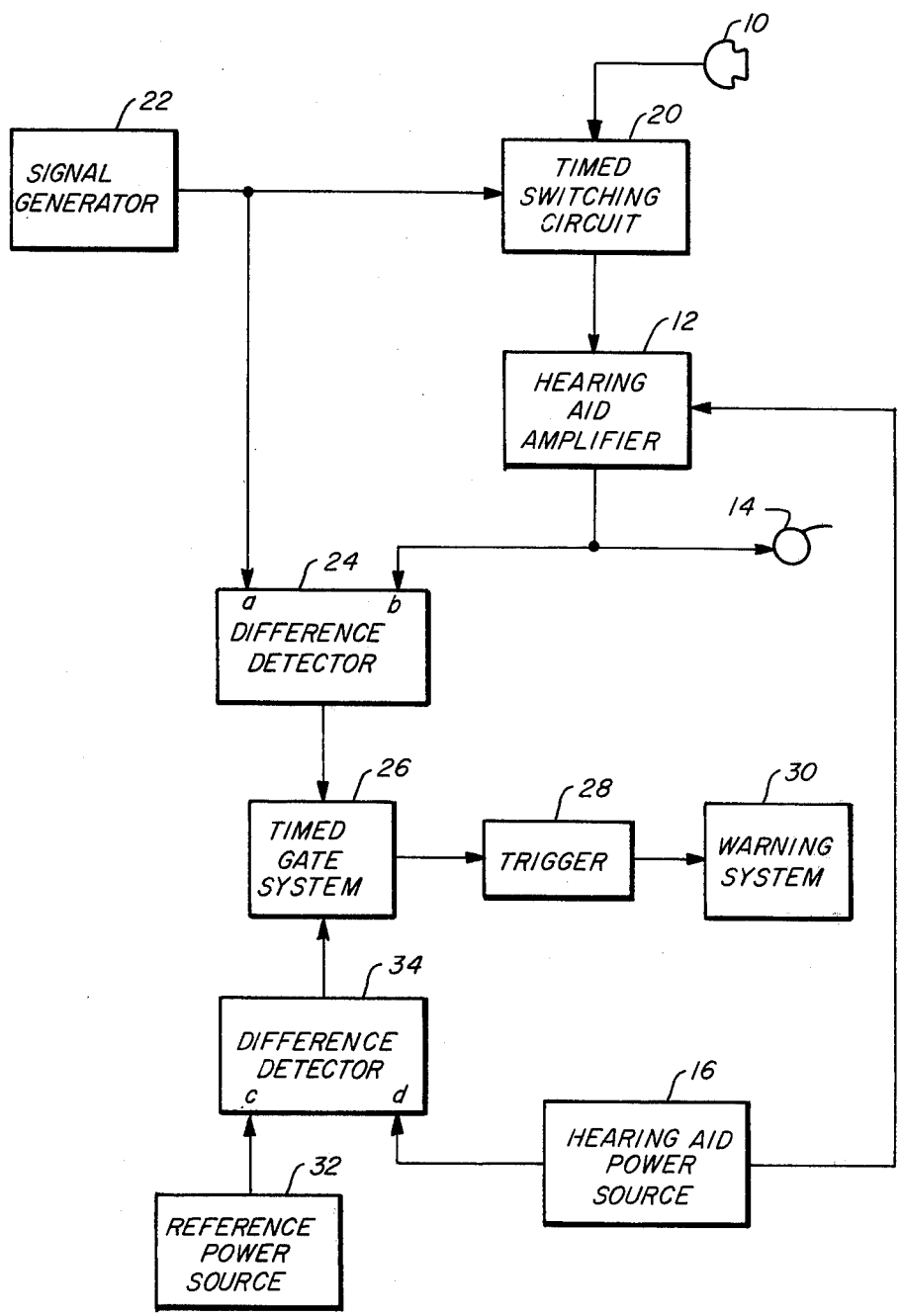
FIG. 1 is a block diagram showing the essential features of the malfunction detection system of the present invention as applied to a hearing aid.

Elements of a malfunction detection system of the present invention are shown with elements of a hearing aid in FIG. 1. A microphone 10 detects an external audio signal and converts it to an electrical signal which is transmitted to a hearing aid amplifier 12. The hearing aid amplifier 12 produces an electrical output signal which is an amplified version of the signal from the microphone 10. The output signal from the hearing aid amplifier 12 is fed to a speaker, or ear piece, 14 which converts the signal to an audio signal to be heard by the user. A hearing aid power source 16 provides the necessary electrical power to operate the hearing aid amplifier 12.

A timed switching circuit 20 is added to the hearing aid circuitry so that the electrical signal from the microphone 10 to the amplifier 12 may be selectively interrupted. A signal generator 22 produces an output signal of constant frequency that is fed to the switching circuit 20. As described in detail hereinafter, the timed switching circuit 20 includes a counting device which is triggered by the oscillations of the constant frequency signal from the generator 22. The switching circuit 20 thus measures a time period T, and interrupts the signal from the microphone 10 once every such period T. The interruption, or test time interval, lasts for another measured time segment t where t is less than T. During the interruption, the switching circuit 20 transmits the signal from the signal generator 22 to the hearing aid amplifier 12 to act as a test signal.

The signal generator 22 also transmits the constant frequency signal to a difference detector 24 as a reference signal. During the test interval, the hearing aid amplifier 12 processes the test signal, and feeds the output signal thus obtained to the difference detector 24 also. The two input terminals of the difference detector are labeled "a" and "b" in FIG. 1.

The difference detector 24 compares the reference signal from the test generator 22 with the test signal as processed by the hearing aid amplifier 12. The two signals are compared with respect to amplitude and frequency. If the test signal differs from the reference signal, in either frequency or amplitude, beyond predetermined limits, the indication is that the hearing aid amplifier 12 is not functioning. Then, a signal is generated by the difference detector 24 sufficient in amplitude to cause to function a timed gate system 26. The gate system 26 operates a trigger 28 which turns on a warning system 30. In this way, the malfunction of the hearing aid amplifier 12 is indicated by the operation of the warning system 30.

The timed gate system 26 operates off of the time switching circuit 20 to allow a signal to reach the trigger 28 only during a test interval t. During the remainder of each time period T, no signal will be generated by the timed gate system 26 to turn on the warning system 30.

During each test interval t, a tone is generated in the ear piece 14 by the processed test signal from the hearing aid amplifier 12. This tone informs the user that the malfunction detection system is itself operating, though no malfunction in the hearing aid may have been detected to operate the warning system.

The hearing aid power source 16, which typically includes one or more batteries, is also tested during each test interval t. The voltage generated by a reference power source 32 and that generated by the hearing aid power source 16 are fed to the input terminals, labeled "c" and "d", respectively, of a second difference detector 34. A signal is produced by the difference detector 34 only when the voltage at input terminal d is less than that at input terminal c, that is, the voltage output of the hearing aid power source is less than the reference voltage. Then, the warning system 30 is turned on as before. In this way, the warning system 30 is used to also reveal the weakening of the hearing aid power source 16.

It will be appreciated that no signal is generated to trigger the warning system 30 other than during a test time interval t, and only then if the fidelity of signal reproduction by the hearing aid amplifier 12 is sufficiently deficient, and/or if the hearing aid power supply is weak beyond a specific limit.

Elements 20 through 34 are added to the hearing aid elements 10 through 16 to function as a malfunction detection system of the present invention. Additional devices not shown in FIG. 1 may be added to the elements 20 through 34 to make the malfunction detection system compatible with, and appropriately coupled to, the hearing aid. Also, circuitry to perform distinct functions as part of the elements 20 through 34 may be made a part of the malfunction detection system as needed or desired. Examples of such additional devices and circuitry are discussed in relation to the more detailed view of an embodiment of the invention shown in FIG. 2. Individual items illustrated in FIG. 2 which are the counterparts of individual items shown in FIG. 1 are labeled with the same number with the addition of a prime. Where a single element shown in FIG. 1 is illustrated as a collection of items in FIG. 2, the latter are labeled with the number used in FIG. 1, with letter suffixes.

Figure 2:
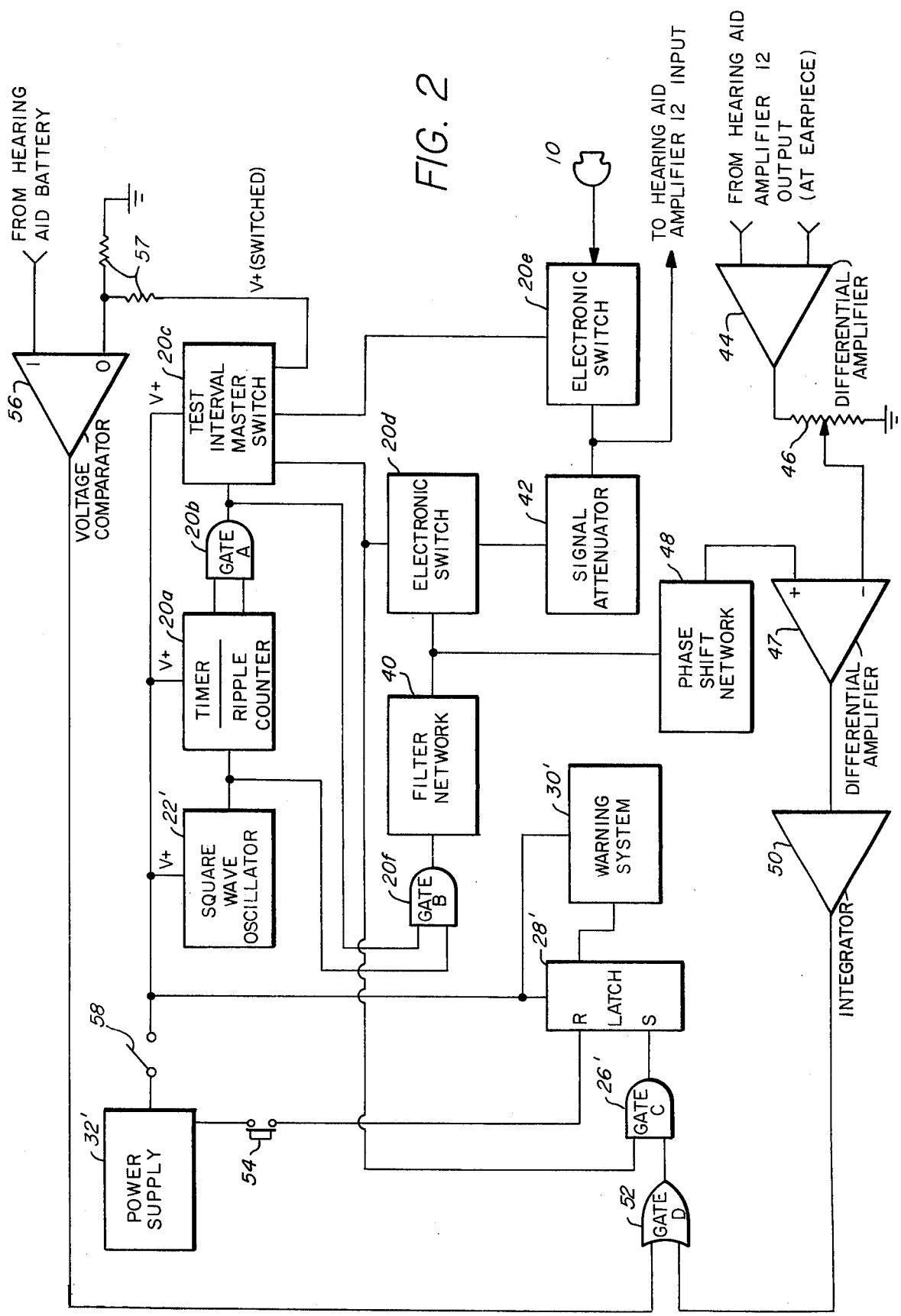
FIG. 2 is a block diagram illustrating additional details of the malfunction detection system shown in FIG. 1, particularly expanding the presentation of the timed switching circuit.

A testing and timing signal of constant frequency $f$, used in the circuit illustrated in FIG. 2, is generated by a square wave oscillator 22'. A timer 20a, which includes a ripple counter, counts the oscillations of the timing signal from the oscillator 22'. Output from two of the ripple counter stages enable a gate A, 20b, for a test time interval t, once in every T time period. While gate A, 20b, is thus enabled, a test interval master switch 20c is operated to perform certain switching functions.

Two electronic switches, 20d and 20e, are operated simultaneously by the master switch 20c. The first electronic switch 20d is normally open, or "off". The second electronic switch 20e is normally closed, or "on". It is only during the test time intervals t that the master switch 20c reverses the conditions of the two electronic switches 20d and 20e, causing 20d to be closed and 20e to be open. These reversed conditions are maintained only during the length of the test time interval t. After the time interval t has ended, the master switch 20c no longer receives a signal from the gate A, 20b, and, consequently, the electronic switches 20d and 20e each return to their respective normal conditions.

With electronic switch 20e closed, the electronic signal generated at the microphone 10 of the hearing aid is passed by this electronic switch 20e to the input of the hearing aid amplifier 12. During the test time interval t the electronic signal from the microphone is interrupted by the open condition of the electronic switch 20e. During that period of time, the closing of the electronic switch 20d permits the passage of the test signal, generated ultimately by the square wave oscillator 22', to the input of the hearing aid amplifier 12 for processing by that amplifier.

The output signal from the square wave oscillator 22' is fed to a gate B, 20f, which also receives the signal generated by gate A, 20b, when the latter gate is enabled to designate the test time interval t. Consequently, during the test time interval t and only then, a square wave of frequency $f$, as generated by the oscillator 22', is fed to a filter network 40 which produces a signal which is essentially sinusoidal, and of the same frequency $f$. The signal wave from the filter network 40 is then the form of the test signal passed by the electronic switch 20d to the hearing aid amplifier 12, and also serves as a reference signal. A signal attenuator 42 attenuates the test signal to a level comparable to that of the typical signals produced by the microphone 10.

The test interval master switch 20c also sends a timed signal during the test time interval t to a gate C, 26', whose function will be described hereinafter. The elements 20a through 20f comprise the timed switching circuit 20 illustrated in FIG. 1. The gate C, 26', is operable by the timed switching circuit 20, and may be made a part thereof.

During the test time interval t, the test signal is processed by the hearing aid amplifier 12 to produce an output signal that is transmitted to the ear piece 14, as illustrated in FIG. 1. The user of the apparatus may sense the corresponding audible tone generated by the ear piece 14. This tone is a signal to the user that the malfunction detection system is operating. The electrical output signal from the hearing aid amplifier 12 is coupled to a differential amplifier 44 of the malfunction detection system. The output of the amplifier 44 is to be compared with the sinusoidal wave produced by the filter network 40 as a reference signal. A potentiometer 46 sets the voltage level applied by the differential amplifier 44 to the inverting input of a second differential amplifier 47. The reference signal from the filter system 40 is phase-adjusted in a phase shift network 48, and applied to the other input of the differential amplifier 47. Three calibration adjustments are provided to assure that the amplitude and frequency of the test signal processed by a properly functioning hearing aid amplifier 12 are the same as those of the referenced signal when both signals are applied to the differential amplifier 47. These calibration adjustments are provided at the signal attenuator 42 to adjust the test signal input to the amplifier 12, by the potentiometer 46 to adjust the voltage level applied at the test signal input to the differential amplifier 47, and in the phase shift network 48 to adjust the phase of the reference signal relative to that of the test signal as processed by the hearing aid amplifier 12.

The output of the differential amplifier 47 is a measure of the differences between the reference signal and the processed test signal with respect to amplitude and frequency. If the hearing amplifier 12 that has processed the test signal is functioning ideally, the amplitudes and frequencies of the two signals applied to the differential amplifier 47 will be identical, respectively. In such case, the output of the differential amplifier 47 will be zero. Any deviation in either the amplitude or the frequency of the processed test signal compared to that of the reference signal will result in a non-zero output by the differential amplifier 47. In any event, the signal output by the differential amplifier 47 is processed by an integrator 50. The integrator 50 produces a ramp DC voltage signal whose maximum value is proportional to the difference in amplitude and/or frequency of the two signals applied to the differential amplifier 47. Therefore, the greater the deviation of the processed test signal from the reference signal at the differential amplifier 47, the larger will be the value of the signal produced by the integrator 50. The output signal from the integrator is fed to a gate D, 52. The gate D, 52, will be enabled by the signal from the integrator 50 only if the integrator signal is at least as large as a predetermined value established by properly adjusting the gate D. Consequently, minor deviations in the processed test signal frequency and/or amplitude compared to the corresponding values of the reference signal may be ignored by the malfunction detection system by simply adjusting gate D, 52, so that this gate will not be enabled by the signals generated by the integrator 50 for such minor differences. In this way, a limitation on the signal distortion to be permitted the hearing aid amplifier 12 may be preset. Thus, a "malfunction" of the hearing aid amplifier 12 is signaled by an output signal from gate D, 52.

A signal from the gate D, 52, received by gate C, 26', during the test time interval $t$, enables the gate C to produce a signal to set a latch 28' which serves as the trigger 28 shown in FIG. 1. The latch 28', in the set configuration, serves to operate the warning system 30', giving an audio and/or visual signal to the user indicating a malfunction in the hearing aid amplifier 12. Once the latch is set by a signal from gate C, 26', it remains in the set configuration, causing the warning system 30' to continue operating. A push button reset switch 54 permits the return of the latch 28' to the reset configuration by the application of a voltage to the reset input terminal of the latch. When this is done, the warning system 30' returns to its non-operating configuration.

The test interval master switch 20c applies a reference voltage to a voltage comparator 56 during the test time interval $t$. A voltage divider 57 reduces the reference voltage to a value considered to be the minimum acceptable value for the voltage supplied to the hearing aid by the hearing aid power source 17 shown in FIG. 1, and may be adjusted as desired to a predetermined voltage value. The hearing aid power source 16 usually takes the form of one or more batteries. Therefore, the voltage from the hearing aid batteries are applied to the test terminal of the voltage comparator 56. As long as the hearing aid battery voltage is greater than or equal to the reference voltage applied to the voltage comparator 56, there will be no output signal from the comparator 56. If the hearing aid battery voltage is less than the reference voltage, a signal will be generated by the voltage comparator 56, and applied to gate D, 52.

A signal from the voltage comparator 56 will enable gate D, 52, thereby producing a signal to gate C, 26', to ultimately trigger the warning system 30' in the same manner as a malfunction of the hearing aid amplifier 12 results in the triggering of the warning system 30'. Consequently, the warning system 30' is operated if the defect in the hearing aid lies in the hearing aid amplifier 12, and/or the power source of the hearing aid has run down beyond a predetermined limit. In either case, the user is alerted to the fact that the hearing aid exhibits a malfunction, and requires some attention.

A power supply 32' acts as the reference power source 32 in FIG. 1 to supply the reference voltage for periodic application by the master switch 20c to test the strength of the hearing aid power source 16 of FIG. 1 in addition to providing the necessary power to operate the elements of the malfunction detection circuitry. A switch 58 permits the malfunction detection system to be turned on or off at will. Once the switch 58 is closed, power is supplied by the power supply 32' to the square wave oscillator 22', certain of the elements of the timed switching circuit (20 in FIG. 1) and to the latch 28' and warning system 30'. The remainder of the elements of the malfunction detection circuit are provided power from the power supply 32' to operate only during the test time interval $t$. In this way, the power supply 32' is called upon to provide power only when and as needed, thereby conserving the power sources within the power supply 32'. By providing the reference voltage to test the power level of the hearing aid battery by an independent power supply 32', and utilizing this power supply to the minimum extent necessary, the source of the reference voltage may readily be designed to last several times the life expectancy of the hearing aid battery. Consequently, the malfunction detection system may be utilized for a long period of time without the necessity of testing the power supply 32' itself compared to the length of time the hearing aid battery may be expected to last without the necessity of a change in this latter power supply.

Gates A, B, and C, 20b, 20f, and 26', respectively, are illustrated as AND gates, while gate D, 52, is illustrated as an OR gate. In the actual construction of the malfunction detection system, these gates may be replaced by gates operating in other logic functions, or by combinations of such gates. The nature of the gates required is affected by the construction and design of the electrical components immediately preceeding and following the respective gates. Such variation in the use of the gates does not deviate from the present invention.

The warning system 30' may take the form of a light, or sound, signal generator, or a combination of a visible and audible alarm device.

The actual physical construction of the malfunction detection system may take any practical form. In the application to the hearing aid, the malfunction detection system may be a separate unit connected to the hearing aid by appropriate wire connections, or, the malfunction detection system may be constructed as a unit which attaches directly to the hearing aid case with the possibility that electrical connections between the two units may be made by simple sockets and plugs.

It will be appreciated that the malfunction detection system illustrated in FIGS. 1 and 2 may be used with virtually any electrical circuit designed to process an electrical signal. In any such case, the electronic switch 20e is used to interrupt the signal processing at some selected stage, or first point, in the circuit to be tested, and to apply at that stage the test signal passed during the test time interval t by the electronic switch 20d. Similarly, the circuit to be tested may be tapped at any succeeding, or second, point to obtain an output signal to be applied to the differential amplifier 44. When this is done, the portion of the circuit to be tested is between the first point at which the test signal is applied from the electronic switch 20d and the second point at which the output signal is taken to be fed to the differential amplifier 44. Then, the fidelity of signals processed by that portion of the circuit being tested is evaluated by comparing the output signal to the reference signal at the differential amplifier 47. Also, the power source of the external circuit to be tested may be evaluated against a reference voltage from the power supply 32' of the malfunction detection system by comparison in the voltage comparator 56.

The method of the present invention involves the steps of periodically interrupting the processing of signals by the circuit to be tested, and interjecting into said circuit to be tested, at a preselected first point, a test signal generated by the malfunction detection system. At a later, or second, point in the circuit to be tested, the circuit is tapped to obtain an output signal that is then compared with a reference signal comparable to the test signal as originally produced by the malfunction detection system. Differences, if any, between the reference signal and the test signal as processed by the circuit to be tested are evaluated, and, where such differences exceed predetermined limits, a triggering signal is generated to operate a warning system. Also, during a predetermined test time interval, the power source supplying power to the circuit to be tested is evaluated by comparing the voltage generated by said power source with a reference voltage supplied by the independent power supply of the malfunction detection system. If the voltage provided by the power supply of the circuit to be tested lies below a predetermined reference voltage value, a signal is generated to trigger the warning system to indicate the power supply deficiency in the circuit to be tested. Consequently, a warning system is triggered whether the circuit to be tested exhibits a malfunction in the fidelity of reproduction of signals, and/or the power source of the signal to be tested falls below a certain power level. The warning system will continue to function until the malfunction detection system is either turning off, or the warning system is returned to its non-operating condition by the operation of a reset device.

The foregoing disclosure and description of the invention is illustrative and explanatory thereof, and various changes in the method steps as well in the details of the illustrated apparatus may be made within the scope of the intended claims without departing from the spirit of the invention.

We claim:

1. A system for detecting malfunctions in hearing aids by periodically applying a test signal at a first point of said hearing aid and comparing the resulting processed signal at a second point of said hearing aid with a reference signal comprising:
   a. signal generation means for providing said test signal and said reference signal;
   b. timed switching means for periodically applying said test signal at said first point of said hearing aid for a test time interval;
   c. first difference detection means for comparing said processed signal with said reference signal to produce a first difference signal whose amplitude is a measure of difference between said processed signal and said reference signal; and
   d. warning system means for indicating whenever said amplitude of said first difference signal exceeds a first value.

2. A system for detecting malfunctions in hearing aids as defined in claim 1 wherein said timed switching means includes:
   a. counter means for determining the period of said periodic application of said test signal at said first point of said hearing aid, and for determining the length of the test time interval during which said test signal is applied at said first point of said hearing aid each period; and
   b. switch means for interrupting the normal operation of said hearing aid at said first point and for transmitting said test signal to said first point of said hearing aid during each test time interval.

3. A system for detecting malfunctions in hearing aids as defined in claim 2 further comprising latch means for operating said warning system means whenever said latch means is triggered by said first difference signal exceeding said first value, and for retaining said warning system means in operation until said latch means is reset.

4. A system for detecting malfunctions in hearing aids as defined in claim 3 further comprising gate means operable by said timed switching means to permit said latch means to be triggered by said first difference signal only during said test time intervals.

5. A system for detecting malfunctions in hearing aids as defined in claim 2 wherein said first difference detection means includes:
   a. differential amplifier means for receiving and comparing said processed signal and said reference signal to produce a first differential output signal whose size and shape are dependent on the difference in frequency and amplitude between said processed signal and said reference signal; and
   b. integrator means for integrating said first differential output signal to produce said first difference signal.

6. A system for detecting malfunctions in hearing aids as defined in claim 5 further comprising latch means for operating said warning system means whenever said latch means is triggered by said first difference signal exceeding said first value, and for retaining said warning system means in operation until said latch means is reset.

7. A system for detecting malfunctions in hearing aids as defined in claim 6 further comprising gate means operable by said timed switching means to permit said latch means to be triggered by said first difference signal only during said test time intervals.

8. A system for detecting malfunctions in hearing aids as defined in claim 5 further comprising power supply means for providing voltage output to operate said system for detecting malfunctions in hearing aids, and for providing a reference voltage, and second difference detection means for comparing the voltage output of the hearing aid power source with said reference voltage to produce a second difference signal whose amplitude is non-zero only when said hearing aid power source voltage output is compared to have a value less than that of said reference voltage, and wherein said reference voltage is applied to said second difference detection means by said time switching means only during said periodic test time intervals, and said warning system means indicates whenever said amplitude of said second difference signal is non-zero.

9. A system for detecting malfunctions in hearing aids as defined in claim 8 further comprising first gate means for permitting either said first difference signal or said second difference signal, on both said first and second difference signals, to cause said warning system means to be operated.

10. A system for detecting malfunctions in hearing aids as defined in claim 9 further comprising latch means for operating said warning system means whenever said latch means is triggered by either said first difference signal or said second difference signal, or both said first and second difference signals, and for retaining said warning system means in operation until said latch means is reset.

11. A system for detecting malfunctions in hearing aids as defined in claim 10 further comprising second gate means operable by said timed switching means to permit said latch means to be triggered by either said first difference signal or said second difference signal, or both said first and second difference signals only during said test time intervals.

12. A system for detecting malfunctions in hearing aids as defined in claim 11 further comprising calibration means to permit calibration of said system for detecting malfunctions so that said reference signal and said test signal processed by a hearing aid without malfunctions will be identical in frequency, amplitude and phase including:
 a. phase shift network means for adjusting the phase of said reference signal relative to said test signal;
 b. attenuation means for adjusting the amplitude of said test signal before application of said test signal at said first point of said hearing aid; and
 c. voltage adjustment means to adjust the voltage level of said processed signal before comparison of said processed signal with said reference signal by said first difference detection means.

13. A system for detecting malfunction in hearing aids as defined in claim 12 wherein said signal generation means is square wave generator means for producing a square wave to serve as a clock signal whose oscillations are counted by said counter means for determining said period and the length of said periodic test time intervals, and further comprising filter network means to which said square wave is also transmitted to convert said square wave to an essentially sinusoidal wave to serve as said test signal and as said reference signal.

14. A system for detecting malfunctions in hearing aids as defined in claim 13 further comprising third gate means operable by said timed switching means to permit said square wave to be converted by said filter network means only during said test time intervals.

15. A system for detecting malfunctions in hearing aids as defined in claim 14 further comprising voltage control means for determining said value of said reference voltage.

16. A system for detecting malfunctions in hearing aids as defined in claim 12 further comprising voltage control means for determining said value of said reference voltage.

17. A system for detecting malfunctions in hearing aids as defined in claim 8 further comprising voltage control means for determining said value of said reference voltage.

18. A system for detecting malfunctions in hearing aids as defined in claim 5 further comprising calibration means to permit calibration of said system for detecting malfunctions so that said reference signal and said test signal processed by a hearing aid without malfunctions will be identical in frequency, amplitude and phase including:
 a. phase shift network means for adjusting the phase of said reference signal relative to said test signal;
 b. attenuation means for adjusting the amplitude of said test signal before application of said test signal at said first point of said hearing aid; and
 c. voltage adjustment means to adjust the voltage level of said processed signal before comparison of said processed signal with said reference signal by said first difference detection means.

19. A system for detecting malfunctions in hearing aids as defined in claim 5 wherein said signal generation means is square wave generator means for producing a square wave to serve as a clock signal whose oscillations are counted by said counter means for determining said period and the length of said periodic test time intervals, and further comprising filter network means to which said square wave is also transmitted to convert said square wave to an essentially sinusoidal wave to serve as said test signal and as said reference signal.

20. A system for detecting malfunctions in hearing aids as defined in claim 19 further comprising gate means operable by said timed switching means to permit said square wave to be converted by said filter network means only during said test time intervals.

21. A system for detecting malfunctions in hearing aids as defined in claim 2 wherein said signal generation means is square wave generator means for producing a square wave to serve as a clock signal whose oscillations are counted by said counter means for determining said period and the length of said periodic test time intervals, and further comprising filter network means to which said square wave is also transmitted to convert said square wave to an essentially sinusoidal wave to serve as said test signal and as said reference signal.

22. A system for detecting malfunctions in hearing aid as defined in claim 21 further comprising gate means operable by said timed switching means to permit said square wave to be converted by said filter network means only during said test time intervals.

23. A system for detecting malfunctions in hearing aids as defined in claim 2 further comprising power supply means for providing voltage output to operate said system for detecting malfunctions in hearing aids, and for providing a reference voltage, and second difference detection means for comparing the voltage output of the hearing aid power source with said reference voltage to produce a second difference signal whose amplitude is non-zero only when said hearing aid power source voltage output is compared to have a value less than that of said reference voltage, and wherein said reference voltage is applied to said second difference detection means by said time switching means only during said periodic test time intervals, and said warning system means indicates whenever said amplitude of said second difference signal is non-zero.

24. A system for detecting malfunctions in hearing aids as defined in claim 23 further comprising voltage control means for determining said value of said reference voltage.

25. A system for detecting malfunctions in hearing aids as defined in claim 2 further comprising calibration means to permit calibration of said system for detecting malfunctions so that said reference signal and said test signal processed by a hearing aid without malfunctions will be identical in frequency, amplitude and phase including:

a. phase shift network means for adjusting the phase of said reference signal relative to said test signal;
b. attenuation means for adjusting the amplitude of said test signal before application of said test signal at said first point of said hearing aid; and
c. voltage adjustment means to adjust the voltage level of said processed signal before comparison of said processed signal with said reference signal by said first difference detection means.

26. A system for detecting malfunctions in electrical signal processing circuits comprising:
a. test signal generation means for generating a test signal characterized by a test frequency;
b. switch means for periodically interrupting signal processing by said electrical circuit for fixed test time intervals, and, during said test time intervals, transmitting said test signal to a first point in said electrical circuit for processing by said electrical circuit beyond said first point to a second point in said electrical circuit;
c. difference detection means, to which said test signal is transmitted from said test signal generation means as a reference signal, and to which said test signal, processed by said electrical circuit, is transmitted from said second point, and which compares the amplitude and frequency of said reference signal with that of said processed test signal to produce a difference signal responsive to said comparison;
d. gate means, to which said difference signal is transmitted, for outputting a trigger signal whenever said difference signal reaches a first amplitude value; and
e. warning signal generation means, to which said trigger signal is transmitted, for producing a warning signal whenever said gate means outputs said trigger signal.

27. A system for detecting malfunctions as defined in claim 26 further comprising voltage comparison means for comparing the voltage of a power source of said signal processing circuit with a reference voltage produced by said system for detecting malfunctions to produce an output signal, whenever said voltage comparison means determines said voltage of said power source to be below said reference voltage, for transmission to said gate means for production of said trigger signal for transmission to said warning signal means for production of a warning signal.

28. A system for detecting malfunctions as defined in claim 27 wherein said switch means operates to permit said voltage comparison to occur only during said test time intervals.

* * * * *